US006686800B2

(12) United States Patent
Krupka

(10) Patent No.: US 6,686,800 B2
(45) Date of Patent: Feb. 3, 2004

(54) LOW NOISE, ELECTRIC FIELD SENSOR

(75) Inventor: Michael Andrew Krupka, San Diego, CA (US)

(73) Assignee: Quantum Applied Science and Research, Inc., San Diego, CA (US)

( * ) Notice: Subject to any disclaimer, the term of this patent is extended or adjusted under 35 U.S.C. 154(b) by 107 days.

(21) Appl. No.: 09/783,858

(22) Filed: Feb. 13, 2001

(65) Prior Publication Data

US 2002/0109545 A1 Aug. 15, 2002

(51) Int. Cl.$^7$ ................................................. H03F 3/45
(52) U.S. Cl. .......................................... 330/69; 330/127
(58) Field of Search ............................ 330/69, 127, 70, 330/97, 259, 290; 324/117 R; 327/309, 312, 321, 323

(56) References Cited

U.S. PATENT DOCUMENTS

| | | |
|---|---|---|
| 3,722,677 A | 3/1973 | Lehnert |
| 5,039,312 A | 8/1991 | Hollis |
| 5,229,593 A | 7/1993 | Cato |
| 5,336,999 A | 8/1994 | Mansfield |
| 5,485,092 A | 1/1996 | Fortin |
| 5,488,677 A | 1/1996 | Tokano |
| 5,574,805 A | 11/1996 | Toba |
| 5,670,870 A | 9/1997 | Muramatsu |
| 5,699,015 A | 12/1997 | Dotson |
| 5,734,296 A | 3/1998 | Dotson |
| 5,751,192 A * | 5/1998 | Main ........................... 330/293 |
| 5,781,003 A | 7/1998 | Kondo |
| 5,798,673 A | 8/1998 | Griffith |
| 5,896,035 A | 4/1999 | Takahashi |
| 6,096,220 A | 8/2000 | Ohkawa |
| 6,111,466 A * | 8/2000 | Mokhtar et al. ............ 330/296 |
| 6,262,631 B1 * | 7/2001 | Li ............................... 330/290 |

OTHER PUBLICATIONS

Horowitz et al. (The Art of Electronocs 2nd Edition, Published 1989) pp. 97 and 183.*
Byrne et al., Ground–Based Instrumentation for Measurements of Atmospheric Conduction Current and Electric Field at the South Pole, pp. 2611–2618, Journal of Geophysical Research, vol. 98, No. D2, Feb. 20, 1993.
Clippingdale et al., Ultrahigh Impedance Capacitively Coupled Heart Imaging Array, pp. 269–270, Rev. Sci. Instrum. 65 (1), Jan. 1994.
Clippingdale et al., Non–Invasive Dielectric Measurements with the Scanning Potential Microscope, pp. 2426–2430, J. Phys. D: Appl. Phys. 27 (1994).
Author Unknown, Ultra Low Input Bias Current Instrumentation Amplifier, pp. 1–9, Burr–Brown Corp 1994.
Harrison, An Antenna Electrometer System for Atmospheric Electrical Measurements, pp. 1599–1603, Rev. Sci. Instrum. 68 (3), Mar. 1997.
Maynard, Electric Field Measurements in Moderate to High Density Space Plasmas with Passive Double Probes, pp. 13–27, Geophysical Monograph 103, American Geophysical Union 1998.
Pedersen, Electric Field Measurements in a Tenuous Plasma with Spherical Double Probes, pp. 1–12, Geophysical Monograph 103, American Geophysical Union 1998.
Prance et al., Non–Contact VLSI Imaging Using a Scanning Electric Potential Microscope, pp. 1229–1235, Meas. Sci. Technol. 9 (1998).
Prance et al., An Ultra–Low–Noise Electrical–Potential Probe for Human–Body Scanning, pp. 1–7, Meas. Sci. Technol. 11 (2000).

* cited by examiner

Primary Examiner—Robert Pascal
Assistant Examiner—Khanh Van Nguyen
(74) Attorney, Agent, or Firm—Nydegger & Associates

(57) ABSTRACT

An electronic circuit stabilizes an ultrahigh input impedance amplifier by altering the amplifier's input potential. This input potential includes both the desired input signal and the amplifier's input bias current. With an amplifier having an input port and a guard, both the input port and the guard will have the same input potential. Accordingly, the stabilizing circuit of the present invention provides the input potential at the guard to an electronic device which separates the input signal from the input bias current. This creates a corrective signal. The corrective signal is then used through a feedback path to alter the input potential so that the desired input signal can be fed into the amplifier without adverse consequences from the input bias current.

23 Claims, 1 Drawing Sheet

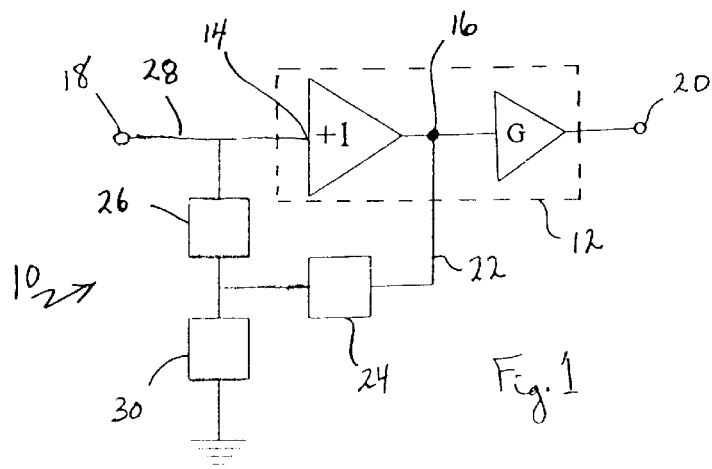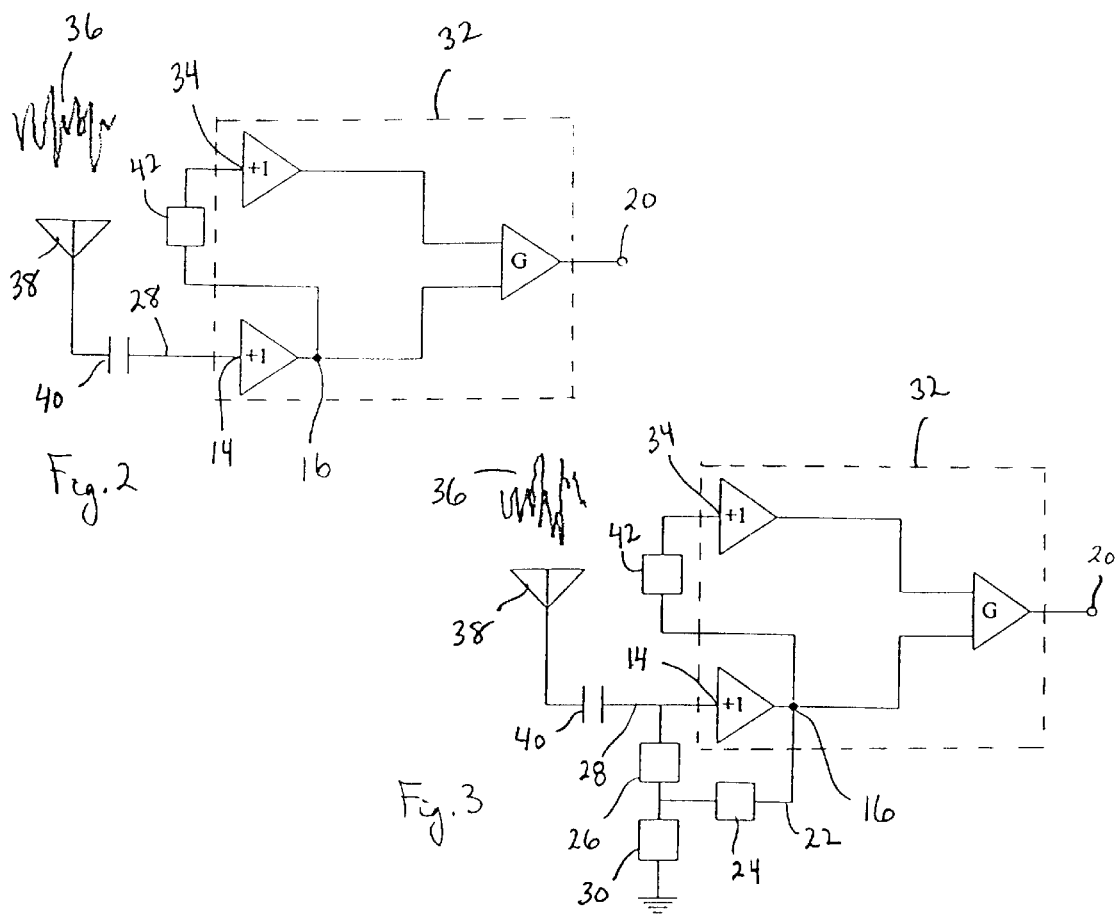

LOW NOISE, ELECTRIC FIELD SENSOR

FIELD OF THE INVENTION

The present invention pertains generally to electronic circuits. More specifically, the present invention pertains to electronic circuits which are useful for stabilizing the operation of an amplifier. The present invention is particularly, but not exclusively, useful as a circuit which removes the input bias current from the input potential to an ultrahigh input impedance amplifier in order to stabilize the amplifier's operation.

BACKGROUND OF THE INVENTION

It is well known that free space electric fields are emitted from many different types of sources. For example, it is known that organs in the human body, such as the heart and the brain, produce electric fields. Also, electric fields are produced whenever vehicles and machinery are operated. Further, they are emitted from many other diverse types of sources, such as active corrosion sites. In each case, for a variety of different reasons, it may be desirable to detect and measure these electric fields.

At low frequency, antennas that are effective for receiving signals from free space electric fields commonly have the properties of a pure voltage source that is in series with a very small capacitance. Consequently, electric field antennas will typically have an ultrahigh impedance that will often be in a range between ten and one hundred giga ohms (10–100 G$\Omega$). Due to this ultrahigh impedance, any amplifier that may be used to amplify signals of the electric field should have an ultrahigh input impedance.

By definition, "matching" involves adjusting a load impedance (e.g. amplifier) to the source impedance (e.g. antenna) so that maximum power is received. Stated differently, matching is necessary so that there is minimal reflection loss due to a mismatch between the source and the load. Accordingly, in order for an amplifier (load) to achieve high coupling efficiency and thereby effectively amplify the signals of an electric field (source) it is often necessary for the amplifier to have an ultrahigh input impedance. Additionally, this input impedance must be purely capacitive. The problem here, however, is that any resistive path of even very high resistance value at the amplifier input, will also act as a short to ground. This will then effectively insert an RC filter into the amplifier input circuit that will adversely affect the coupling between the antenna and the amplifier. For example, for an amplifier having an input impedance of 100 G$\Omega$, and a resistive path to ground of 1 G$\Omega$ at the amplifier input, only 1% of the signal will be coupled into the amplifier. Thus, it is generally desirable to remove resistive paths to ground at the amplifier input.

Although the removal of resistive paths from an amplifier input may improve the coupling efficiency of the amplifier, it will not necessarily solve all of the problems that are presented by an ultrahigh input impedance amplifier. Specifically, the removal of resistive paths from the amplifier input still does not account for the amplifier's inevitable input bias current. In general, the input bias current is a nonsignal current that is either d.c. in nature or has a very low frequency. In any event, unless the input bias current is somehow accounted for, it will flow onto the amplifier input capacitance and onto the source capacitance, and thereby produce a continual drift in the input signal level. This can then lead to saturation of the amplifier. For example, it can be shown that for an input bias current of 50 fA and an input capacitance of 10 pF, an amplifier with a gain of 1000 would saturate in approximately 2 seconds.

In light of the above it is an object of the present invention to provide a system and method for stabilizing an amplifier that enables an ultrahigh input impedance amplifier to be connected directly to a free space electric field antenna without the provision of a current path to ground to shunt the input bias current away from the amplifier input. Another object of the present invention is to provide a system and method for stabilizing an amplifier that allows the amplifier to be connected to ultrahigh impedance sources with high coupling efficiency. Still another object of the present invention is to provide a system and method for stabilizing an amplifier that is effectively easy to use, relatively simple to manufacture, and comparatively cost effective.

SUMMARY OF THE PREFERRED EMBODIMENTS

A system for stabilizing an ultrahigh input impedance amplifier includes an antenna for receiving an a.c. input signal from a free space electric field. The system also includes an input line that is used to feed the input signal from the antenna to an input port of the amplifier. As envisioned by the present invention, the amplifier will internally generate a substantially d.c. input bias current that combines with the input signal to create an input potential at the input port of the amplifier. As further envisioned by the present invention, the amplifier will also have a guard, and the same input potential will be established on the guard as well as at the input port. Recall, this input potential includes both the input signal and the input bias current. Importantly, the ultrahigh impedance amplifier does not, however, include any uncompensated resistive paths to ground at its input.

In overview, for the operation of the system of the present invention, the input potential is taken from the guard. The input bias current in this input potential is then separated from the input signal to establish a corrective signal. Next, the corrective signal is used to alter the input potential at the input port of the amplifier. The result is that the input bias current is effectively eliminated from the amplifier input. Consequently, the ultrahigh impedance of the antenna can be matched with the ultrahigh impedance of the amplifier, and the amplifier's operation can be stabilized.

In detail, for one embodiment of the present invention, a capacitor is connected to the guard of the amplifier. Specifically, in this embodiment the capacitor is used to remove the input bias current (essentially a d.c. signal) from the input potential. Thus, the input signal itself (an a.c. signal) is established as the corrective signal. Additionally, a high impedance path is connected between the capacitor and the amplifier's input port to influence the input potential at the input port with the corrective signal. More specifically, the corrective signal (i.e. input signal) from the capacitor blocks the input signal portion of the input potential at the diode to remove the input bias current from the input potential. The input bias current, by itself, is then provided a path to ground.

For an alternate embodiment of the present invention, a differential amplifier is contemplated. In this case, the system includes a low pass filter that is connected between the guard and an additional input port of the differential amplifier. The low pass filter then blocks transmission of the input signal (essentially a high frequency a.c. signal) in the input potential from the guard. Thus, the input bias current (a low frequency of d.c. signal) is used as the corrective signal. This corrective signal is then fed into the additional input port of the amplifier and is used in the amplifier to cancel the input bias current from the input potential at the input port.

In the specific case where a differential amplifier is used, a combination of the embodiments mentioned above can be incorporated. Specifically, the input potential at the guard can be fed through a low pass filter to the additional input port of the amplifier. As discussed above, this will allow the input bias current to be used for canceling itself in the amplifier. At the same time, the input potential at the guard can be passed through a capacitor to a high impedance path that is connected between the capacitor and the input port of the amplifier. As discussed above, this circuitry allows the input bias current in the input potential to be shunted to ground and to thereby remove the input bias current from the input potential.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 1 is a circuit schematic drawing of a preferred embodiment of the present invention for use in stabilizing an ultrahigh input impedance amplifier;

FIG. 2 is a circuit schematic drawing of another preferred embodiment of the present invention for use in stabilizing an ultrahigh input impedance differential amplifier; and FIG. 3 is an alternate embodiment of the circuit shown in FIG. 2.

DESCRIPTION OF THE PREFERRED EMBODIMENT

Referring initially to FIG. 1, a circuit in accordance with the present invention is shown and is generally designated 10. As shown, the circuit 10 includes an amplifier 12 which has an input port 14 and a guard 16. As contemplated for the present invention, the guard 16 is of a type that is known to the skilled artisan. Essentially, the guard 16 provides a voltage that can be used to minimize leakage of the signal to the environment during passage to the input port 14 of the amplifier 12. Importantly, the input port 14 and the guard 16 will have the same input potential.

In accordance with the normal operation of an amplifier, the amplifier 12 receives an input signal 18; amplifies the input signal 18 by a gain, G; and then provides the amplified input signal 18 as an output 20. The present invention, however, contemplates that the input signal 18 is received from a source having an ultrahigh impedance which can disrupt the normal operation of an amplifier.

As is well known in the pertinent art, for the amplifier 12 to be operationally effective, the input impedance of the amplifier 12 needs to be matched to the input impedance of the source. When an ultrahigh impedance is involved, however, the input bias current that is inherently generated by an amplifier 12 can cause a rapid saturation of the amplifier 12. Further, the use of resistive paths from the input port 14 to ground, which can normally be used to shunt the input bias current from the input port 14 of the amplifier 12, can not be used when an ultrahigh impedance is involved. This is so because their presence effectively shunts the signal to ground to thereby divert it away from the amplifier input. As appreciated by the present invention, however, the input potential at both the input port 14 and the guard 16 will be the same, and it will include both the input signal 18 (an a.c. signal) and the input bias current of the amplifier 12 (essentially a d.c. signal). The solution, then, is to somehow remove the input bias current from the input potential at the input port 14.

Still referring to FIG. 1, for one embodiment of the present invention the circuit 10 includes a guard line 22, which interconnects the guard 16 with an electronic device 24. For purposes of the present invention, the device 24 is preferably a capacitor having a capacitance. The device 24 may, however, be a filter. In either case, the purpose of the device 24 is to isolate the input bias current (i.e. d.c. signal, or very low frequency signal) and separate it from the input signal 18 that is taken from the guard 16. Recall, the input potential at the guard 16, and at the input port 14, includes both the input signal 18 and the input bias current from the amplifier 12. The result for the circuit 10 shown in FIG. 1 is that the device 24 creates a corrective signal which is essentially the a.c. input signal 18. Further, for this embodiment of the present invention, another electronic device 26 is interconnected between the device 24 and the input line 28 that is used to feed the input signal 18 to the input port 14. For the present invention, the device 26 is preferably a diode of a type well known in the pertinent art. Specifically, the device 26 (diode) is connected into the circuit 10 so that the input potential at the input port 14 will interact with the corrective signal from the device 24 (i.e. the input signal 18). For the present invention, the diode of device 26 is connected backwards into the circuit 10. This is done to present a very high impedance to ground at the input port 14. Conduction through device 26 (diode) this occurs via the leakage current of the device 26. This leakage current may be very small (e.g. a few pA). Alternatively the device 26 is a resistor of value sufficiently high to minimize conduction of the signal away from the amplifier input due to imbalance in the potentials of the guard 22 and input line 28. The purpose here is for this interaction to block the input signal 18 from passing through the device 26. On the other hand, the concerted operation of the devices 24 and 26 allows the input bias current in the input potential to pass through the device 26 and through a resistor 30 to ground. Consequently, the input bias current is removed from the input potential at the input port 14.

Referring now to FIG. 2, an alternate embodiment of the present invention contemplates the use of a differential amplifier 32 that, along with the input port 14, also has an additional input port 34. Also, FIG. 2 illustrates an exemplary free space electric field 36 that is being received by an antenna 38. More specifically, the free space electric field 36 will include the input signal 18 and the antenna 38 will include a capacitance 40 that is actually part of the antenna 38. In effect, these components (electric field 36, antenna 38 and the capacitance 40 that is included in the antenna 38) represent a source that generates the input signal 18 and has an ultrahigh impedance input for the amplifier 32. At this point it is to be appreciated that the same type of source for input signal 18 (i.e. electric field 36, antenna 38 and capacitance 40) would also be representative of the input to the amplifier 12 discussed above with reference to FIG. 1.

In FIG. 2 it will be seen that an electronic device 42 is interconnected between the guard 16 and the additional input port 34 of the differential amplifier 32. Preferably, the device 42 is a low pass filter which passes signals having frequencies below approximately one tenth of a Hertz (<0.1 Hz). The purpose of this low pass filter (device 42) is to remove the input signal 18 from the input potential to create a corrective signal that effectively includes only the input bias current (d.c. signal). This corrective signal (i.e. the input bias current) is fed to the additional input port 34 of the amplifier 32 and is then used in the amplifier 32 to cancel the input bias current from the input potential.

In yet another embodiment of the present invention, the circuitry shown in FIG. 1 is combined with the circuitry shown in FIG. 2. As shown in FIG. 3, for this embodiment of the present invention, a capacitor (device 24) and a diode (device 26) combine to eliminate the input bias current from the input potential. At the same time, a low pass filter (device 42) is also used to effectively achieve the same end.

An important aspect of the circuits respectively shown for the present invention in FIGS. 1, 2 and 3, is that they are all intended for use whenever there is an ultrahigh impedance input (e.g. 10–100 GΩ), such as is presented by a small antenna 38 used at low frequency. In operation, they all are incorporated to stabilize amplifiers 12, 32 by effectively removing the input bias current of the amplifiers 12, 32 from their input potential. Specifically, for the present invention, this is done by taking the input potential from the guard 16, and then separating the input bias current from the input signal 18 in the input potential to create a corrective signal. This corrective signal is then used as feedback to alter the input potential. The result is to effectively remove the input bias current from the input potential. Consequently, the amplifiers 12, 32 can use their respective gains, G, for subsequent detection and measurement of the input signal 18.

While the particular Low Noise, Electric Field Sensor as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A system for stabilizing an amplifier to measure a free space electric field, wherein said amplifier generates an input bias current, said input bias current being combined with an input signal to create an input potential at an input port of said amplifier, and wherein said amplifier has a guard having said same input potential, said system comprising:

an ultrahigh impedance antenna positioned in the electric field for receiving the input signal from the electric field;

a means connected with said guard for receiving said input potential therefrom;

a means connected with said receiving means for separating said input bias current from said input potential to establish a corrective signal; and a means connected with said separating means for altering said input potential with said corrective signal to stabilize said input signal at said input port.

2. A system as recited in claim 1 wherein said antenna has an impedance in the range of 10 to 100 Gigahertz.

3. A system as recited in claim 2 wherein said input signal is an a.c. signal and said input bias current is substantially a d.c. signal, and further wherein said corrective signal is said input signal.

4. A system as recited in claim 3 wherein said separating means is a capacitor.

5. A system as recited in claim 4 wherein said altering means is a diode connected between said capacitor and said input signal to remove said d.c. signal from said input potential.

6. A system as recited in claim 4 wherein said altering means is a high value resistor connected between said capacitor and said input signal to remove said d.c. signal from said input potential.

7. A system as recited in claim 2 wherein said input signal is an a.c. signal and said input bias current is substantially a d.c. signal, and further wherein said corrective signal is said input bias current.

8. A system as recited in claim 7 wherein said separating means is a low pass filter having a cut-off frequency of approximately one tenth of a Hertz (0.1 Hz).

9. A system as recited in claim 8 wherein said amplifier is a differential amplifier with an additional input port, wherein said corrective signal is fed into said additional input port and wherein said altering means is said amplifier.

10. An electronic circuit for stabilizing an amplifier to measure a free space electric field, said amplifier having an input port and a guard with said input port and said guard having a same input potential, wherein said input potential includes an input bias current from said amplifier and an input signal, said circuit comprising:

an antenna positioned in the electric field for receiving said input signal from the electric field, said antenna having an ultrahigh impedance;

an input line connected with said input port for providing said input signal to said amplifier;

a guard line connected with said guard to receive said input potential therefrom;

a first means connected to said guard line for separating said input signal in said input potential from said input bias current to generate a corrective signal; and a second means connected between said input port and to said first means for altering said input potential with said corrective signal to stabilize said input signal at said input port of the amplifier.

11. An electronic circuit as recited in claim 10 wherein said free space electric field is generated by a human being.

12. An electronic circuit as recited in claim 10 wherein said free space electric field is generated by a machine.

13. An electronic circuit as recited in claim 10 wherein said free space electric field is generated by an active corrosion site.

14. An electronic circuit as recited in claim 10 wherein said input signal is an a.c. component and said input bias current is substantially a d.c. component and wherein said first means is a capacitor for removing said d.c. component from said input potential to establish said a.c. component as said corrective signal, and further wherein said second means includes a diode to interact with said corrective signal to remove said d.c. component from said input potential.

15. An electronic circuit as recited in claim 10 wherein said input signal is an a.c. component and said input bias current is substantially a d.c. component and wherein said first means is a capacitor for removing said d.c. component from said input potential to establish said a.c. component as said corrective signal, and further wherein said second means includes a high impedance path to interact with said corrective signal to remove said d.c. component from said input potential.

16. An electronic circuit as recited in claim 10 wherein said amplifier is a differential amplifier having an additional input port with said first means interconnecting said input port with said additional input port, also wherein said input signal is an a.c. component and said input bias current is substantially a d.c. component, and further wherein said first means is a low pass filter connected into said guard line to substantially remove said a.c. component from said input signal to generate said corrective signal, and still further wherein said second means is said differential amplifier.

17. A method for stabilizing an amplifier to measure a free space electric field, wherein said amplifier has an input port and a guard with a same input potential, and wherein said input potential includes a first component from said amplifier and a second component from an antenna having an ultrahigh impedance, said method comprising the steps of:

positioning the antenna in the electric field;

receiving the second component from said antenna positioned in the electric field;

obtaining the input potential from the guard;

separating the first component from the second component to create a corrective signal; and altering the input potential with the corrective signal to stabilize the second component at the input port of the amplifier.

18. A method as recited in claim 17 wherein the first component is a d.c. signal, the second component is an a.c. signal, and wherein the corrective signal is the a.c. signal.

19. A method as recited in claim 18 wherein the altering step includes the step of blocking the input potential with the corrective signal to remove the d.c. signal from the input potential.

20. A method as recited in claim 17 wherein the first component is a d.c. signal, the second component is an a.c. signal, wherein the corrective signal is the a.c. signal, and further wherein the amplifier is a differential amplifier having an additional input port.

21. A method as recited in claim 20 wherein the altering step includes the steps of:

feeding the corrective signal to the additional input port of the amplifier; and using the corrective signal with the input potential in the amplifier to cancel the d.c. signal from the input potential.

22. A system for stabilizing an amplifier having an input port and a guard to measure a free space electric field which comprises:

an antenna positioned in a free space electric field and having an ultrahigh impedance for receiving an a.c. input signal from the electric field;

an input line for feeding said input signal from said antenna to said input port of said amplifier;

electronic means in said amplifier for combining an input bias current from said amplifier with said input signal to create a same input potential at said input port and on said guard;

a capacitor connected to said guard for removing said input bias current from said input potential to establish said input signal as a corrective signal; and a high impedance path connected between said capacitor and said input line to influence said input potential with said corrective signal to remove said input bias current from said input potential at said input port.

23. A system for stabilizing a differential amplifier having an input port and a guard to measure a free space electric field which comprises:

an antenna positioned in a free space electric field and having an ultrahigh impedance for receiving an a.c. input signal from the electric field;

an input line for feeding said input signal from said antenna to said input port of said amplifier;

electronic means in said amplifier for generating a substantially d.c. input bias current and for combining said input bias current with said input signal to create a same input potential at said input port and on said guard; and a low pass filter connected between said guard and an additional input port of said differential amplifier for removing said input signal from said input potential to establish said input bias current as a corrective signal in said amplifier to cancel said input bias current from said input potential at said input port.

* * * * *